(12) United States Patent
Kobuse et al.

(10) Patent No.: US 7,649,341 B2
(45) Date of Patent: Jan. 19, 2010

(54) STORAGE BATTERY UNIT

(75) Inventors: Shun Kobuse, Tokyo (JP); Keizo Yamada, Tokyo (JP); Yoshiaki Machiyama, Tokyo (JP); Kouji Ohtsu, Tokyo (JP)

(73) Assignee: Shin-Kobe Electric Machinery Co., Ltd., Tokyo (JP)

( * ) Notice: Subject to any disclaimer, the term of this patent is extended or adjusted under 35 U.S.C. 154(b) by 0 days.

(21) Appl. No.: 11/755,297

(22) Filed: May 30, 2007

(65) Prior Publication Data

US 2007/0273329 A1 Nov. 29, 2007

Related U.S. Application Data

(63) Continuation of application No. PCT/JP2005/021449, filed on Nov. 22, 2005.

(51) Int. Cl.
*H02J 7/00* (2006.01)
(52) U.S. Cl. .................................. 320/136; 320/134
(58) Field of Classification Search ................ 320/107, 320/109, 110, 112, 116, 119, 120, 132, 134, 320/136; 429/90, 91, 92, 93; 324/429, 427
See application file for complete search history.

(56) References Cited

U.S. PATENT DOCUMENTS 5,159,272 A * 10/1992 Rao et al. .................... 324/429
5,381,295 A * 1/1995 Rund et al. ................... 361/92
5,717,310 A 2/1998 Sakai et al.
6,777,909 B1 * 8/2004 Aberle et al. ................ 320/104

FOREIGN PATENT DOCUMENTS

| JP | 01234023 | | 9/1989 |
| JP | 09163616 | | 6/1997 |
| JP | 09163616 | A * | 6/1997 |
| JP | 2004-200412 | | 7/2004 |

OTHER PUBLICATIONS

International Search Report for PCT/JP2005/021449.

* cited by examiner

*Primary Examiner*—Bao Q Vu
*Assistant Examiner*—Jue Zhang
(74) *Attorney, Agent, or Firm*—Pearne & Gordon LLP

(57) ABSTRACT

A storage battery unit (1) including a storage battery (2) and a monitoring device (3) that monitors a state of the storage battery using an output of the storage battery as an input, wherein, in order to prevent the monitoring device from consuming electric power in a state before use of the storage battery and prevent nonfunctioning of the monitoring device in use of the storage battery, a starting circuit (4) is provided between the storage battery and the monitoring device (3), the starting circuit including: a main switch that holds an OFF state in a state before a load is connected to the storage battery and interrupts supply of electric power from the storage battery (2) to the monitoring device; and a switch drive circuit that detects a reduction in terminal voltage of the storage battery that occurs when the load exceeding the set value is connected to the storage battery, and sets the main switch to an ON state.

14 Claims, 7 Drawing Sheets

STORAGE BATTERY UNIT

This application is a Continuation under 35 USC 111 of PCT/JP2005/021449 (WO 2006/059511) filed on Nov. 22, 2005, claiming priority of Japanese Application No. 2004-345407 filed Nov. 30, 2004.

TECHNICAL FIELD OF THE INVENTION

The present invention relates to a storage battery unit comprising a storage battery and a monitoring device that monitors a state of the storage battery.

PRIOR ART OF THE INVENTION

Transportation machines such as automobiles driven by an engine include a storage battery for driving a starter motor and other electrical components. The storage battery deteriorates with use and reaches the end of its life in due time. In order to prevent sudden occurrence of such a situation that the engine cannot be started, it is necessary to accurately learn a state of the storage battery and replace the storage battery before the end of its life. When the storage battery is insufficiently charged, the storage battery needs to be charged before the start of the engine. Thus, in the storage battery used for starting the engine, it is desirable that a user can learn the state of the storage battery when checking a vehicle or the like. Thus, as disclosed in Japanese Patent Application Laid-Open Publication No. 2000-285968, a storage battery unit is proposed in which a monitoring device that monitors a charging state or a deteriorating state of a battery is mounted to a battery jar, and the monitoring device is integrated into the storage battery.

The monitoring device that monitors the state of the storage battery is comprised of electronic devices including a microcomputer, and if the monitoring device is in an operation state, the monitoring device always consumes electric power. Thus, if the storage battery to which the monitoring device is connected is left displayed on store shelves for a long time without being charged, the battery discharges during that time. The storage battery which is once completely discharged is unsaleable because of a significant reduction in discharge properties. Thus, conventionally, until the storage battery is used, a lead wire connecting the monitoring device and the storage battery is disconnected or a manually operated power switch provided in the monitoring device is turned off to interrupt supply of electric power to the monitoring device.

However, in the case where the lead wire connecting the monitoring device and the storage battery is disconnected or the power switch provided in the monitoring device is turned off to interrupt supply of electric power to the monitoring device, the monitoring device is not operated if connection of the lead wire or turning on of the power switch is omitted in use of the storage battery, which makes it impossible to monitor the state of the storage battery.

In the conventional storage battery unit in which the monitoring device is mounted to the battery jar of the storage battery, the monitoring device is bonded on an upper surface of a lid of the battery jar or bonded on a side surface or the like of the battery jar, and thus the monitoring device significantly protrudes from the upper surface or the side surface of the battery jar, which increases the size of the storage battery and impairs an appearance thereof. When the monitoring device is secured by bonding to the battery jar of the storage battery, it is necessary to apply an adhesive while strictly controlling the amount of the adhesive so as to prevent the adhesive from squeezing out from between the monitoring device and the battery jar, and also cure of the adhesive takes time, which reduces production efficiency of the storage battery unit and increases production costs.

SUMMARY OF THE INVENTION

An object of the present invention is to provide a storage battery unit including a storage battery and a monitoring device that monitors a state of the storage battery, in which the monitoring device is disconnected from the storage battery in a state before the storage battery unit is mounted to an automobile or the like and used to prevent the monitoring device from unnecessarily consuming electric power, and the monitoring device is automatically connected to the storage battery after the storage battery unit is mounted to the automobile or the like and once used, thereby allowing the monitoring device to be operated without trouble.

Another object of the present invention is to provide a storage battery unit including a storage battery and a monitoring device that monitors a state of the storage battery, in which the monitoring device is prevented from unnecessarily consuming electric power before use of the storage battery, the monitoring device is reliably connected to the storage battery to accurately monitor the state of the battery after the use of the storage battery, and the monitoring device can be mounted to a lid of a battery jar of the storage battery substantially without changes in contour and dimension of the battery and without bonding that requires an expensive process.

The present invention relates to a storage battery unit including: a storage battery in which a generation element including a positive electrode and a negative electrode is housed in a battery jar and positive and negative output terminals are mounted to a lid of the battery jar; and a monitoring device that monitors a state of the storage battery using an output of the storage battery as an input. In the present invention, a starting circuit is inserted between the output terminal of the storage battery and an input terminal of the monitoring device. The starting circuit includes a main switch that holds an OFF state in a state before a load exceeding a set value is connected to the storage battery and interrupts supply of electric power from the storage battery to the monitoring device, and a switch drive circuit that detects a reduction in terminal voltage of the storage battery that occurs when the load exceeding the set value is connected to the storage battery, and sets the main switch to an ON state.

The set value of the load (a load current value or power consumption) is set to a value at which a voltage across the storage battery exhibits a detectable reduction when the load is connected to the storage battery. The load is generally a starter motor used for starting an engine that drives an automobile, or a motor that drives a drive wheel of a motor-driven vehicle, but may be a head lamp or the like.

The storage battery unit is comprised as described above so that the starting circuit is provided between the storage battery and the monitoring device, and when the load exceeding the set value is connected to the storage battery, the main switch of the starting circuit is set to the ON state to supply electric power to the monitoring device. Thus, when the storage battery unit is displayed on store shelves or the like and unused, the monitoring device can be disconnected from the storage battery to prevent the monitoring device from unnecessarily consuming electric power, thereby preventing complete discharge of the storage battery and a reduction in discharge properties.

Also, comprised as described above, after the storage battery unit is mounted to an automobile or the like and once used, the monitoring device is automatically connected to the storage battery, thereby preventing the storage battery from being used in a state where the monitoring device does not function.

In a preferred aspect of the present invention, the main switch is comprised of a switch element that is set to an ON state when a drive signal is provided, and inserted between one output terminal of the storage battery and one input terminal of the monitoring device. The switch drive circuit includes a drive signal supply circuit that has a driving switch that is set to an ON state when an ON command signal is provided and provides a drive signal to the main switch when the driving switch is in the ON state, and an ON command signal generation circuit that provides an ON command signal to the driving switch when detecting a reduction in terminal voltage of the storage battery that occurs in driving the load. In this case, the monitoring device is comprised so as to continuously provide the ON command signal to the driving switch when a voltage is supplied to the monitoring device from the storage battery through the main switch.

When the automobile or the like is driven after the storage battery is mounted to the automobile, a load (such as a starter motor or a vehicle driving motor) exceeding the set value is always connected to the storage battery. Thus, comprising as described above allows the monitoring device to be reliably connected to the storage battery.

In another preferred aspect of the present invention, the driving switch has a self-hold function. When the driving switch has the self-hold function, the main switch can be held in the ON state without providing an ON command signal from the monitoring device to the driving switch.

Comprised as described above, there is no need of providing the ON command signal from the monitoring device to the driving switch, thereby simplifying a construction of the monitoring device, and reducing electric power consumption of the monitoring device.

The main switch may be comprised of a field-effect transistor or a bipolar transistor.

In a further preferred embodiment of the present invention, the main switch itself is comprised of a switch element having a self-hold function such as a thyristor, and inserted between one output terminal of the storage battery and one input terminal of the monitoring device. In this case, the switch drive circuit is comprised so as to detect a reduction in terminal voltage of the storage battery that occurs when the starter motor is driven and provide a drive signal to the main switch.

Comprised as described above, the switch drive circuit can be comprised of a circuit that detects the reduction in terminal voltage of the storage battery that occurs when the load is driven, thereby simplifying a construction of the starting circuit. Also, there is no need of always providing a drive signal to the main switch, thereby reducing electric power consumption of the starting circuit.

In the preferred aspect of the present invention, the switch drive circuit has a manual operation switch, and is comprised so as to forcedly provide a drive signal to the main switch when the manual operation switch is operated.

In the case where the switch drive circuit is comprised so that the manual operation switch is operated to forcedly provide the drive signal to the main switch, the manual operation switch is operated to connect the monitoring device to the storage battery without waiting for use of the storage battery (connection of the load exceeding the set value to the storage battery), thereby allowing the state of the storage battery to be confirmed as required before the storage battery is mounted to the automobile or the like.

In a further preferred aspect of the present invention, components of the monitoring device and components of the starting circuit are housed in a common package to constitute a battery monitoring module, and the package of the battery monitoring module is fitted and housed in a recess provided in an upper surface of the lid of the battery jar of the storage battery.

Comprised as described above, the monitoring device can be mounted to the battery jar without using an adhesive, and without the monitoring device protruding significantly or at all from the upper surface of the battery jar, thereby allowing the monitoring device to be mounted to the lid of the battery jar of the storage battery without impairing an appearance of the storage battery and without undergoing an expensive process.

In a further preferred aspect of the present invention, the package of the battery monitoring module is comprised so as to have an appearance of a flat plate shape, and a battery state display portion that displays a state of the storage battery is provided on a surface of the package exposed through an opening of the recess.

Comprised as described above, the monitoring device can be mounted to the battery jar without protruding significantly or at all from the upper surface of the battery jar, thereby preventing the appearance of the storage battery from being impaired by mounting the monitoring device and preventing significant changes in contour and dimension of the storage battery. Also, the battery state display portion is provided on the surface of the package of the module, thereby facilitating confirmation of the state of the storage battery.

In a further preferred aspect of the present invention, positive and negative battery connecting lead plates for connecting the starting circuit to a positive output terminal and a negative output terminal, respectively, of the storage battery are led out in opposite directions from one end and the other end of the package of the monitoring module. In this case, each battery connecting lead plate has a strip-like portion connected at one end to a corresponding input terminal of the starting circuit, and an annular portion provided integrally at the other end of the strip-like portion, and is connected to a corresponding output terminal of the storage battery in a state where the annular portion is fitted to the corresponding output terminal of the storage battery. Also, part of the strip-like portion of each battery connecting lead plate is bent to form a shock absorbing portion in the strip-like portion of each battery connecting lead plate, and the shock absorbing portion is deformed to allow expansion and contraction of the strip-like portion of each lead plate.

Comprised as described above, the monitoring device can be connected to the storage battery simply by fitting the annular portion provided in each battery connecting lead plate to the corresponding output terminal of the storage battery, thereby simplifying mounting of the monitoring device.

Generally, the output terminal of the storage battery is tapered so that an upper end has a smaller outer diameter than that of a lower end. When the output terminal of the storage battery is thus comprised, the annular portion of each of the positive lead plate and the negative lead plate is formed so as to have an inner diameter smaller than the outer diameter of the lower end of each of the positive output terminal and the negative output terminal, and larger than the outer diameter of the upper end of each of the positive output terminal and the negative output terminal.

It is preferable that a plurality of slits extending in the radial direction of the annular portion are provided at spaced intervals circumferentially of the annular portion in an inner peripheral portion of the annular portion of each lead plate.

As described above, the slits are provided in the inner peripheral portion of the annular portion of each lead plate, thus when the annular portion is fitted to the output terminal of the storage battery, the inner peripheral portion of the annular portion can be deformed by the slits, thereby facilitating fitting and securing of the output terminal of the storage battery body to the annular portion of the lead plate, and providing good electrical connection between the annular portion and the output terminal of the storage battery.

In a further preferred aspect of the present invention, a thickness of the package is set so that the upper surface of the package of the monitoring module housed in the recess provided in the lid of the battery jar is flush with the upper surface of the lid of the battery jar.

As described above, the thickness of the package of the battery monitoring module is set, and thus the monitoring module can be mounted without protruding from the upper surface of the lid of the battery jar, thereby preventing the appearance from being impaired. Also, comprised as described above, the contour and dimension of the storage battery is not changed by mounting the monitoring device, and thus an installation state of the storage battery is not changed by replacement of the storage battery. Thus, the monitoring device is mounted to the battery jar to prevent compatibility of the storage battery from being lost.

In a further preferred aspect of the present invention, the thickness of the package is set so that the surface of the package of the monitoring module housed in the recess provided in the lid of the battery jar is flush with the upper surface of the lid of the battery jar, and a boundary between the upper surface of the lid of the battery jar and the surface of the package of the monitoring module is covered with a film.

As described above, the boundary between the upper surface of the lid of the battery jar and the upper surface of the monitoring module is covered with the film, thereby increasing weatherization and dust resistance of the monitoring device.

In a further preferred aspect of the present invention, a positive lead housing groove having one end connected to the recess in the upper surface of the lid of the battery jar and the other end reaching a position near the lower end of the positive output terminal of the storage battery, and a negative lead housing groove having one end connected to the recess and the other end reaching a position near the lower end of the negative output terminal of the storage battery are formed in the upper surface of the lid of the battery jar, and the strip-like portion of the positive battery connecting lead plate and the strip-like portion of the negative battery connecting lead plate are housed in the positive lead housing groove and the negative lead housing groove, respectively.

Comprised as described above, the strip-like portions of the positive battery connecting lead plate and the negative battery connecting lead plate are not placed in a protruding manner from the surface of the lid of the battery jar, thereby preventing the appearance of the storage battery from being impaired. Also, the strip-like portions of the positive battery connecting lead plate and the negative battery connecting lead plate do not protrude from the surface of the lid of the battery jar, thereby preventing damage to the lead plates.

As described above, according to the present invention, the storage battery unit is comprised so that the starting circuit is provided between the storage battery and the monitoring device, and when the load exceeding the set value is connected to the storage battery, the main switch of the starting circuit is set to the ON state to supply electric power to the monitoring device. Thus, when the storage battery unit is displayed on store shelves or the like and unused, the monitoring device can be disconnected from the storage battery to prevent the monitoring device from unnecessarily consuming electric power, thereby preventing complete discharge of the storage battery and a reduction in discharge properties.

Also, according to the present invention, after the storage battery unit is mounted to an automobile or the like and once used, the monitoring device is automatically connected to the storage battery, thereby preventing the storage battery from being used in a state where the monitoring device does not function.

In the present invention, in the case where the components of the monitoring device and the components of the starting circuit are housed in the common package to constitute the battery monitoring module, and the package of the battery monitoring module is fitted and mounted in the recess provided in the upper surface of the lid of the battery jar of the storage battery, the monitoring device can be mounted to the battery jar without using an adhesive. Thus, the storage battery unit can be produced without undergoing a troublesome and expensive bonding process. Also, the monitoring device can be mounted without protruding significantly or at all from the upper surface of the battery jar, thereby preventing the appearance of the storage battery from being impaired by mounting the monitoring device and preventing compatibility of the storage battery from being lost by changes in contour and dimension of the storage battery.

BRIEF DESCRIPTION OF THE DRAWINGS

The above and other objects and features of the invention will be apparent from the detailed description of the preferred embodiment of the invention, which is described and illustrated with reference to the accompanying drawings, in which.

DETAILED DESCRIPTION OF THE PREFERRED EMBODIMENT

Now, a preferred embodiment of a storage battery unit according to the present invention will be described in detail with reference to the drawings.

Figure 1:
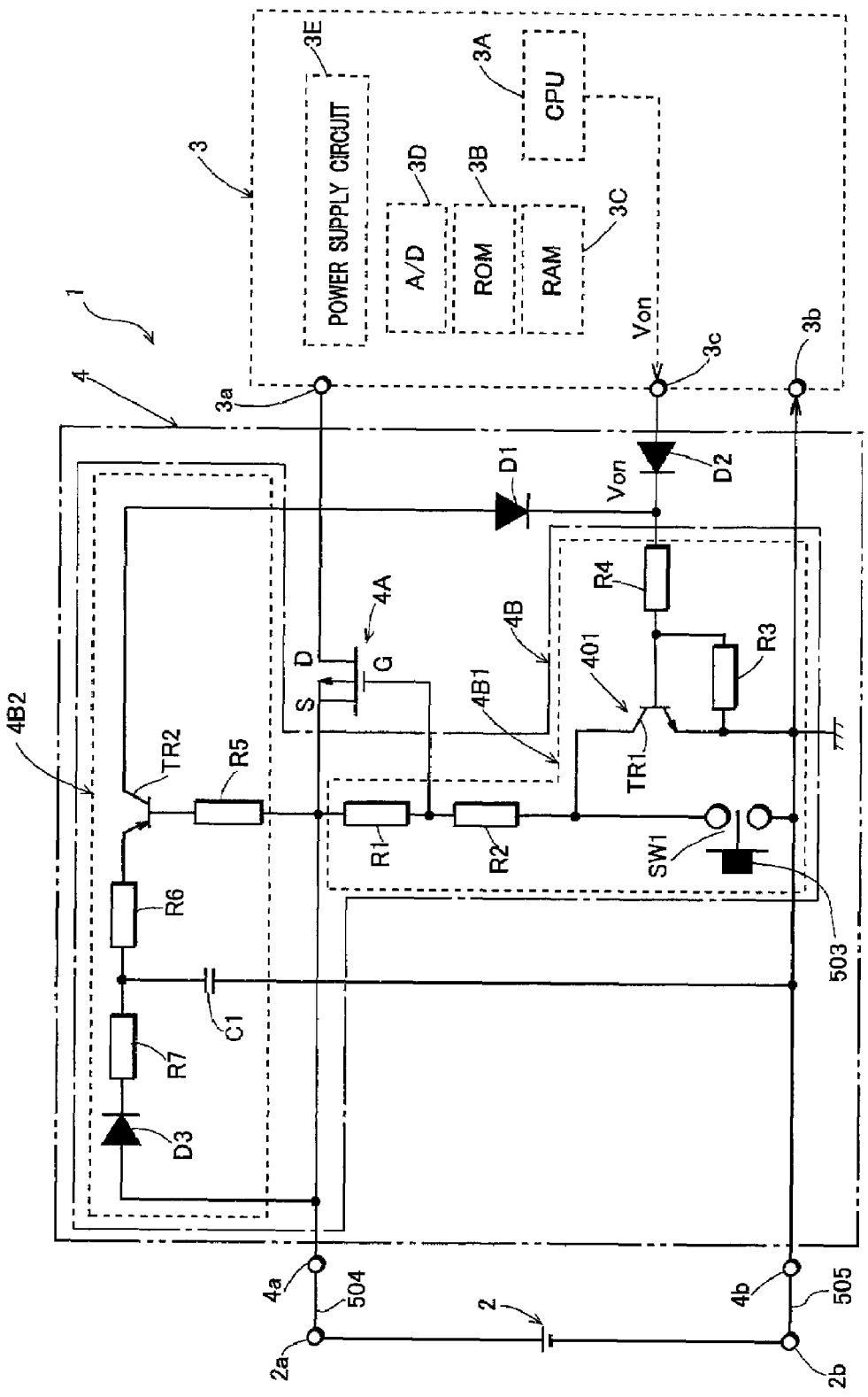
FIG. 1 is a schematic circuit diagram of an example of an electrical construction of a storage battery unit according to the present invention.

FIG. 1 is a schematic circuit diagram of an example of an electrical construction of a storage battery unit 1 according to the present invention. The storage battery unit 1 according to the present invention includes a storage battery 2, a monitoring device (a diagnosing device) 3 that monitors a state of the storage battery 2 using an output of the storage battery 2 as an input, and a starting circuit 4 inserted between output terminals 2a and 2b of the storage battery 2 and input terminals 3a and 3b of the monitoring device 3.

Figure 2:
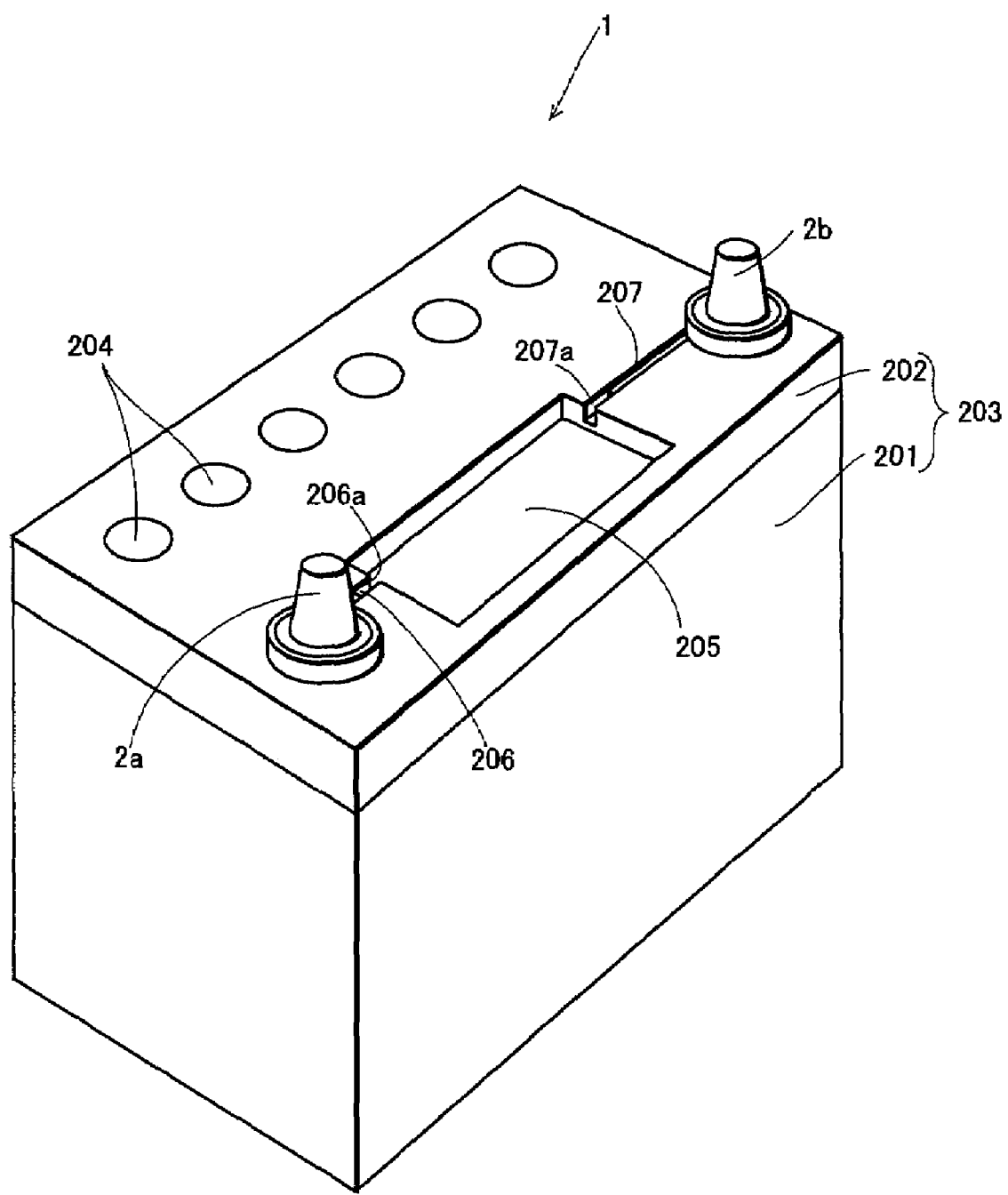
FIG. 2 is a perspective view of an example of an appearance of a storage battery used in the storage battery unit according to the present invention.

The storage battery 2 used in the embodiment is an automotive lead storage battery of JIS B19 size, and as shown in FIG. 2, includes a battery jar 203 comprised of a rectangular parallelepiped battery jar body 201 and a lid 202 that closes an opening at an upper end of the battery jar body, and a generation element (not shown) including a positive electrode and a negative electrode housed in the battery jar 203, and a positive output terminal 2a and a negative output terminal 2b are mounted to the lid 202. The output terminals 2a and 2b are mounted near opposite ends in a longitudinal direction of the lid 202 and closer to one end in a width direction of the lid 202. On the other end side in the width direction of the lid 202, six liquid injection ports 204 are formed communicating with six cells formed in the battery jar, and an unshown vent plug is mounted to each liquid injection port. Each of the output terminals 2a and 2b of the storage battery is tapered so that an upper end has a smaller outer diameter than that of a lower end. In the embodiment, the battery jar body 201 and the lid 202 are made of injection-molded polypropylene parts similarly to a generally used battery jar of an automotive lead storage battery.

In order to mount a battery monitoring module described later to the lid 202 of the battery jar 203, a recess 205 is formed in an upper surface of the lid 202. The recess 205 is provided in a position offset to the output terminals 2a and 2b of the storage battery so that the battery monitoring module does not interfere with the vent plug and an indicator (not shown) mounted to the lid of the battery jar. In the shown example, the recess 205 is provided between the output terminals 2a and 2b closer to the output terminal 2a. The recess 205 is formed to have a rectangular outline according to the shape of the battery monitoring module described later, and a depth of the recess 205 is set so that a back surface (a surface facing the battery jar) at a bottom of the recess 205 is positioned slightly higher than an upper end of the battery jar body 201. The depth of the recess 205 is thus set for preventing problems in thermal welding of the lid 202 to the battery jar body 201. On the upper surface of the lid 202 of the battery jar, a linear positive lead housing groove 206 having one end connected to the recess 205 and the other end reaching a position near the lower end of the positive output terminal 2a of the storage battery, and a linear negative lead housing groove 207 having one end connected to the recess 205 and the other end reaching a position near the lower end of the negative output terminal 2b of the storage battery.

Figure 3:
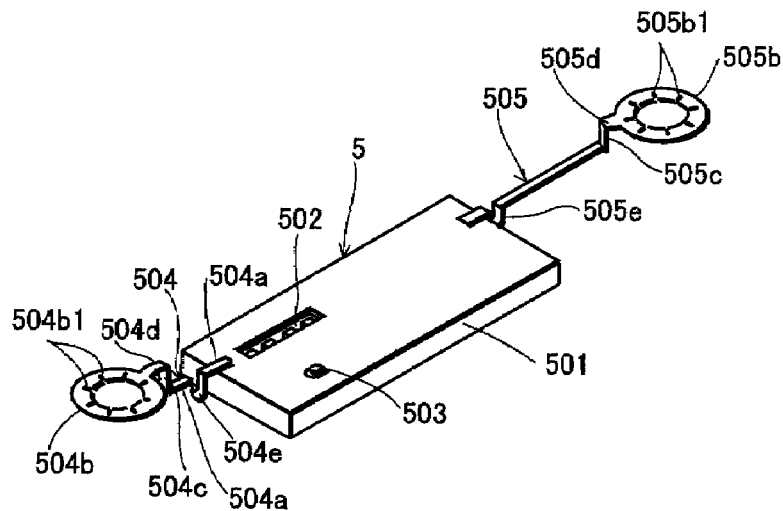
FIG. 3 is a perspective view of an example of an appearance of a battery monitoring module used in the storage battery unit according to the present invention.

In the present invention, components of the monitoring device 3 and components of the starting circuit 4 are housed in a common package 501 as shown in FIG. 3 to constitute a battery monitoring module 5. The package 501 is preferably made of an insulating material, but may be made of a conductive metal material when there is a specific reason such that a circuit in the package needs to be shielded. In the embodiment, the package 501 is made of the same resin material (polypropylene) as the battery jar. Other resin having good formability, for example, polyethylene terephthalate (PET) resin may be used as the resin material for the package.

The shown package 501 of the battery monitoring module 5 is comprised to have an appearance of a flat plate shape. On a surface of the package 501, a battery state display portion 502 that displays a state of the storage battery is provided, and a push button 503 that operates a manual operation switch provided in the starting circuit is led out. Electrical connection between the battery monitoring module 5 and the output terminal of the storage battery is preferably performed using a reliable connection conductor that has vibration resistance and is less subject to influence of ambient environment. Thus, in the embodiment, positive and negative battery connecting lead plates 504 and 505 for connecting a positive input terminal 4a and a negative input terminal 4b of the starting circuit 4 to the positive output terminal 2a and the negative output terminal 2b of the storage battery 2 are led out in opposite directions from one end and the other end in a longitudinal direction of the package 501 of the monitoring module 5.

The battery connecting lead plates 504 and 505 have strip-like portions 504a and 505a connected at one ends to corresponding input terminals 4a and 4b of the starting circuit 4, and annular portions 504b and 505b provided integrally at the other ends of the strip-like portions 504a and 504b. In the shown example, portions closer to the other ends of the strip-like portions 504a and 505a are bent upward at a right angle to form rising portions 504c and 505c, and upper ends of the rising portions are bent at a right angle in a direction parallel to plate surfaces of the strip-like portions 504a and 505a to form front end portions 504d and 505d, and the annular portions 504b and 505b are integrally formed in the front end portions. The rising portions 504c and 505c form steps between the strip-like portions 504a and 505a and the annular portions 504b and 505b of the lead plates 504 and 505.

The annular portions 504b and 505b provided in the positive lead plate 504 and the negative lead plate 505, respectively each have an inner diameter smaller than the outer diameter of the lower end of each of the tapered positive output terminal 2a and negative output terminal 2b of the storage battery and larger than the outer diameter of the upper end of each of the positive output terminal 2a and the negative output terminal 2b, and the annular portions 504b and 505b are tightly fitted and connected to the lower ends of the output terminals 2a and 2b, respectively, of the storage battery.

The lead plates 504 and 505 used in the embodiment are made of tin-plated spring phosphor bronze having a thickness of 0.2 mm, and the inner diameter of each of the annular portions 504b and 505b is set to be 0.2 mm smaller than the outer diameter of the lower end of each of the output terminals 2a and 2b of the storage battery.

In inner peripheral portions of the annular portions 504b and 505b of the lead plates 504 and 505, a plurality of (eight in the shown example) slits (cuts) 504b1 and 505b1 extending radially of the annular portions are provided at regularly spaced intervals circumferentially of the annular portions. The plurality of slits are thus formed in the inner periphery of the annular portion of each lead plate, and thus when each annular portion is fitted to a corresponding output terminal of the storage battery, each annular portion can be easily elastically deformed and reliably fixedly fitted to the corresponding output terminal of the storage battery, thereby ensuring electrical connection between each lead plate and the output terminal of the storage battery.

Also, portions closer to the package 501 of the strip-like portions 504a and 505a of the battery connecting lead plates 504 and 505 are bent into a U-shape to form shock absorbing portions 504e and 505e in part of the strip-like portions 504a and 505a. The shock absorbing portions 504e and 505e are easily deformed to allow expansion and contraction of the strip-like portions 504a and 505a when stress by thermal expansion or contraction occurs in the lead plates 504 and 505 or when stress occurs in the lead plates 504 and 505 by mechanical vibration transmitted to the lead plates 504 and 505, thereby absorbing the stress that occurs in the lead plates 504 and 505.

Figure 4:
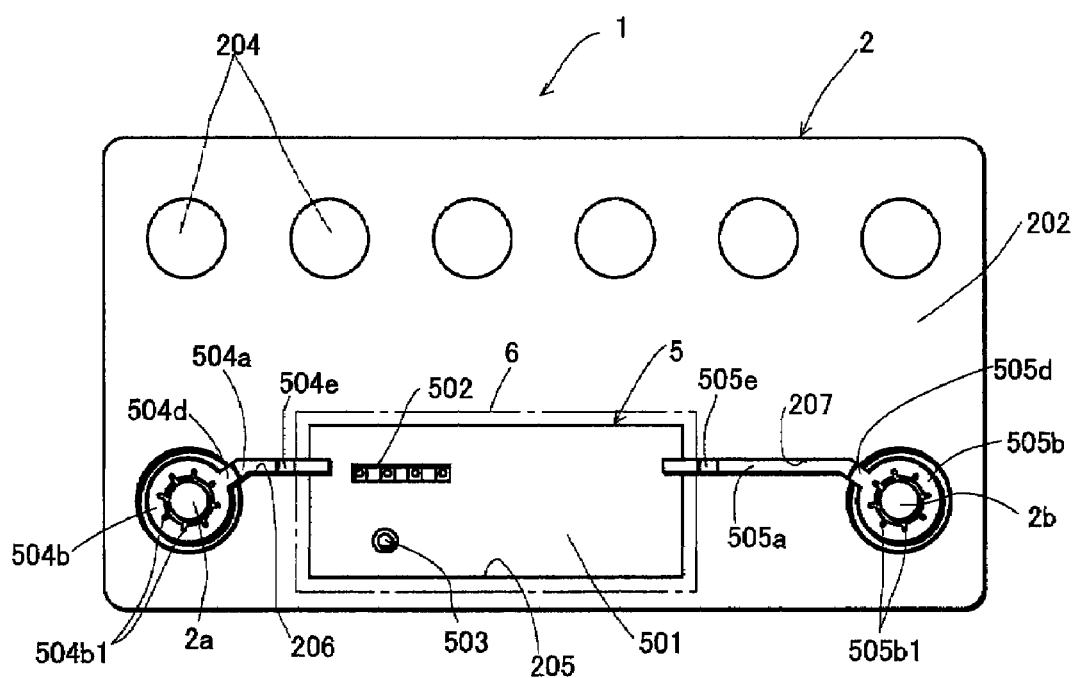
FIG. 4 is a top view of the storage battery unit according to the present invention comprised by mounting the battery monitoring module in FIG. 3 to the storage battery in FIG. 2.

As shown in FIG. 4, the package 501 of the battery monitoring module 5 housing therein the components of the monitoring device 3 and the starting circuit 4 is placed in a state of being fitted in the recess 205 provided in the lid of the battery jar with a surface thereof (a surface provided with the display portion 502) facing upward. The annular portions 504b and 505b of the battery monitoring module 5 are fitted to the output terminals 2a and 2b of the storage battery, and the strip-like portions 504a and 505a of the battery connecting lead plates 504 and 505 are placed in a state of being fitted in the positive lead housing groove 206 and the negative lead housing groove 207 provided in the lid of the battery jar.

The positive lead housing groove 206 and the negative lead housing groove 207 have lengths adapted to lengths of the strip-like portions of the lead plates fitted therein, and portions 206a and 207a closer to the recess 205 of the positive lead housing groove 206 and the negative lead housing groove 207 are formed to have sizes that can receive with clearance the shock absorbing portions 504e and 505e formed in the strip-like portions 504a and 505a of the lead plate so as not to prevent deformation of the shock absorbing portions 504e and 505e.

Orientations of the front end portions 504d and 505d of the lead plates 504 and 505 and steps (heights of the rising portions 504c and 505c) between the strip-like portions 504a and 505a and the annular portions 504b and 505b are set so that the annular portions 504b and 505b are fitted to the lower ends of the output terminals 2a and 2b of the storage battery when the strip-like portions 504a and 505a of the lead plates 504 and 505 are fitted in the groove portions 206 and 207, respectively.

The thickness of the package 501 of the battery monitoring module 5 is set to be equal to the depth of the recess 205 formed in the lid 202 of the battery jar so that the surface of the package 501 is flush with the upper surface of the lid 202 of the battery jar in a state where the package 501 is fitted in the recess 205. In the shown example, a resin film (or sheet) 6 that covers at least a boundary between the upper surface of the lid of the battery jar and the upper surface of the package 501 is applied for sealing between the package 501 and a peripheral edge of an opening of the recess 205. The shown film 6 is made of a transparent resin material, and provided to cover the peripheral portion of the opening of the recess 205 and the entire surface of the package 501.

Terminal fittings mounted to ends of unshown output cables are mounted to portions above portions of the output terminals 2a and 2b of the storage battery to which the annular portions 504b and 505b are fitted.

As described above, the shock absorbing portions 504c and 505c are formed in the strip-like portions 504a and 505a of the lead plates 504 and 505, thus when heat generated by the engine causes thermal expansion or contraction of the strip-like portions 504a and 505a, or running of the automobile causes vibration of the strip-like portions 504a and 505a, the shock absorbing portions 504c and 505c are deformed to absorb stress that occurs in the strip-like portions 504a and 505a. This can prevent a break of the strip-like portions 504a and 505a, a crack in the package 501 near leading portions of the lead plates 504 and 505, or poor connection between the annular portions 504b and 505b and the output terminals 2a and 2b of the storage battery.

In the shown example, the strip-like portions 504a and 505a of the lead plates 504 and 505 are partly bent into a U shape to form the shock absorbing portions 504c and 505c, but the strip-like portions 504a and 505a may be partly bent into a V shape or a corrugated shape to form the shock absorbing portions 504c and 505c. In the shown example, one shock absorbing portion 504c and one shock absorbing portion 505c are provided in the strip-like portions 504a and 505a, respectively, but a plurality of shock absorbing portions may be provided in each strip-like portion as required. In order to reduce remaining bending stress of the lead plate, it is preferable that a bend R of the bent part that constitutes the shock absorbing portion is not very small.

As a metal material (including an alloy material) for the battery connecting lead plates 504 and 505, a material having low electric resistance is preferably used, but a material having relatively high electric resistance may be used depending on conditions such that a load current passing through the monitoring device 3 is low.

As a metal material for the battery connecting lead plates 504 and 505, a material having high strength is preferably used, but when strength of the metal material is insufficient, a thickness of the metal plate is increased to cope therewith.

In view of operating environment of the storage battery, the lead plates 504 and 505 are preferably made of a metal material having high corrosion resistance, but the lead plates 504 and 505 may be made of a metal material having low corrosion resistance by plating, coating, resin coating, or cladding on a surface of the metal material.

Further, in order to ensure connection between the annular portions 504b and 505b of the lead plates and the output terminal of the storage battery, the metal material for the lead plate requires appropriate coefficient of elasticity and stretch. However, the lead plate that meets the requirement may be made of a metal material having somewhat lower coefficient of elasticity and stretch by appropriately setting a thickness of the metal material unless the material undergoes brittle fracture by slight stress.

Metal materials that meet the above described conditions include various copper alloys such as copper, bronze, phosphor bronze, spring phosphor bronze, or brass, iron alloys such as iron and various stainless, or nickel and nickel alloys.

As described above, the components of the monitoring device 3 and the components of the starting circuit 4 are housed in the common package 501 to constitute the battery monitoring module 5, and the package of the module is fitted in the recess 205 provided in the lid of the battery jar and mounted so as not to protrude from the lid of the battery jar. Thus, the outer diameter of the storage battery including the monitoring device can be made equal to that of a storage battery including no monitoring device, thereby preventing compatibility of the storage battery from being lost, and allowing easy application to existing automobiles.

As described above, in the case where the film 6 is applied so as to cover the boundary between the upper surface of the lid of the battery jar and the upper surface of the package 501 so that the surface of the monitoring module is flush with the upper surface of the lid of the battery jar, the boundary between the package of the module and the upper surface of the lid of the battery jar can be sealed to prevent water from entering the recess 205, thereby increasing weatherization, water resistance and dust resistance. Further, in the case where the film is provided so as to cover the entire surface of the package 501, patterns may be printed on the film to improve design, or an operation method of the monitoring device may be printed on the film 6. In this case, a face plate that displays the operation method of the monitoring device can be omitted, thereby reducing costs.

The storage battery unit according to the present invention is suitable for use as an engine starting power supply of a transportation machine such as an automobile driven by a gasoline engine or a diesel engine (including a ship), or a motor driving power supply of a small motor-driven vehicle such as a motor-driven scooter. In such a transportation machine, a space for mounting the storage battery and a mass allowable to the storage battery are limited in relation to a mounting weight of the vehicle and a mounting space for the vehicle, and thus a storage battery as small in size and mass as possible is preferably used. According to the present invention, the battery monitoring module can be mounted to the battery jar of the storage battery substantially without changes in size and shape of the existing storage battery, and thus a function of monitoring the battery state can be added without problems to a storage battery for a transportation machine that is limited in size and mass.

In order to mount the monitoring device to the storage battery while limiting an increase in size and mass of the automotive storage battery as much as possible, it is preferable to form the monitoring device as small in size as possible. As a monitoring device having a function of diagnosing a charging state or a deteriorating state of the storage battery and displaying the state, various types of devices are known such as a device that measures a terminal voltage of the storage battery, a temperature of the storage battery, an impedance of the storage battery, or an integrated value of operation time of the storage battery, and arithmetically operates a charging state or a deteriorating state from the data, or a device that uses a map that provides a relationship between the data and the charging state or the deteriorating state, and retrieves the map with respect to the measured data to calculate the charging state or the deteriorating state, and any type of monitoring device may be used in the present invention.

The electronic components that constitute the monitoring device 3 and the starting circuit 4 may be mounted on a printed board in a discrete manner, but the electronic components are preferably integrated into an IC for a reduction in size. For higher reliability and a reduction in cost and size, components of a microcomputer and a circuit therearound are preferably integrated into an LSI. The components of the monitoring device and the starting circuit are integrated into an IC or an LSI, and thus the components of the monitoring device and the starting circuit can be housed without problems in the package 501 that can be fitted in the recess 205 without protruding from the recess, the recess 205 being provided in the lid of the battery jar of the lead storage battery of JIS B19 size.

Next, with reference to FIG. 1, exemplary constructions of the monitoring device 3 and the starting circuit 4 will be described. The monitoring device 3 in FIG. 1 includes a microcomputer having a CPU 3A, a ROM 3B, a RAM 3C, an A/D converter 3D, or the like, and a power supply circuit 3E that outputs a power supply voltage suitable for driving the microcomputer using an output voltage of the storage battery 2 as an input, and detection values of conditions such as a terminal voltage or a temperature of the storage battery required for determining the state of the storage battery are input to the CPU 3A through the A/D converter 3D.

The monitoring device 3 causes the CPU 3A to execute a predetermined program stored in the ROM 3B and perform an arithmetical operation for determining the charging state or the deteriorating state of the storage battery, and causes the battery state display portion 502 to display the determination results (the state of the storage battery), the battery state display portion 502 having a liquid crystal display plate or a light emitting diode as display means.

In the monitoring device 3, the condition for determining the state of the battery and the arithmetical operation for determining the state of the battery may be known ones, and detailed descriptions thereof will be omitted.

The starting circuit 4 includes a main switch 4A that holds an OFF state in a state before a load exceeding a set value is connected to the storage battery 2 (when the storage battery is displayed on store shelves or the like and unused) to interrupt supply of electric power from the storage battery 2 to the monitoring device 3, and a switch drive circuit 4B that detects a reduction in terminal voltage of the storage battery when the load exceeding the set value is connected to the storage battery 2 to set the main switch to an ON state.

The main switch 4A is comprised of a switch element that is set to the ON state when a drive signal is provided, and inserted between one output terminal of the storage battery 2 and one input terminal of the monitoring device 3. In the shown example, the main switch 4A is comprised of a P-channel type MOSFET, and a source S thereof is connected to the positive input terminal 4a of the starting circuit, and a drain thereof is connected to the positive input terminal 3a of the monitoring device 3. The negative input terminal 4b of the starting circuit and the negative input terminal 3b of the monitoring device 3 are grounded.

The shown switch drive circuit 4B is comprised of a drive signal supply circuit 4B1 that has a driving switch 401 that is set to an ON state when an ON command signal is provided, and provides a drive signal to the main switch 4A when the driving switch is in the ON state, and an ON command signal generation circuit 4B2 that provides an ON command signal to the driving switch 401 when detecting a reduction in terminal voltage of the storage battery that occurs in driving the starter motor.

In the shown example, as the driving switch 401 of the drive signal supply circuit 4B1, an NPN transistor TR1 having a grounded emitter is used. Resistors R1 and R2 are connected in series between a collector of the transistor TR1 and the positive input terminal 4a of the starting circuit, and a gate G of the MOSFET that constitutes the main switch 4A is connected to a connection between the resistors R1 and R2. A base of the transistor TR1 is connected to the emitter of the transistor through a resistor R3, and connected through a resistor R4 to an output terminal (a common connection of cathodes of diodes D1 and D2) of an OR circuit comprised of the diodes D1 and D2 having the cathodes commonly connected. Also, a manual operation switch SW1 comprised of a push button switch is connected between the collector and the emitter of the transistor TR1. A push button 503 of the manual operation switch is led out from the surface of the package 501 of the battery monitoring module 5, and the switch SW1 is closed only when the push button is pushed.

The drive signal supply circuit 4B1 is comprised of the transistor TR1, the resistors R1 to R4, and the manual switch SW1. In the embodiment, the switch drive circuit 4B is comprised so as to forcedly provide a drive signal to the main switch when the manual switch SW1 is operated.

The ON command signal generation circuit 4B2 is comprised of a PNP transistor TR2, a resistor R5 connected between a base of the transistor TR2 and the positive input terminal 4a of the starting circuit, a resistor R6 connected at one end to an emitter of the transistor TR2, a diode D3 having a cathode connected to the other end of the resistor R6 through a resistor R7 and an anode connected to the positive input terminal 4a of the starting circuit, and a capacitor C1 connected between a connection between the resistors R6 and R7 and the negative input terminal 4b (a ground) of the starting circuit and having a sufficiently large capacitance. A collector of the transistor TR2 is connected to an anode of the diode D1, and when the transistor TR2 is set to an ON state, an ON command signal Von is output from the storage battery 2 through the diode D3, the resistors R7 and R6, and between the emitter and the collector of the transistor TR2.

The monitoring device 3 has an ON command signal output terminal 3c that continuously outputs the ON command signal Von when a power supply voltage is supplied to the CPU 3A (when a terminal voltage of the storage battery 2 is supplied between the input terminals 3a and 3b), and the ON command signal Von obtained from the output terminal 3c is input to the base of the transistor TR1 (the driving switch) through the diode D2 and the resistor R4. Specifically, the monitoring device 3 is comprised so as to continuously provide the ON command signal to the driving switch 401 when the voltage is supplied from the storage battery 2 through the main switch 4A to the monitoring device 3.

An operation of the starting circuit 4 in FIG. 1 is as described below. In the starting circuit 4, the capacitor C1 is charged to a power supply voltage of the storage battery by a voltage across the storage battery 2 through the diode D3 and the resistor R7. When the storage battery 2 is unused (when a load exceeding a set value has never been connected to the storage battery), the voltage across the storage battery 2 and the voltage across the capacitor C1 are substantially equal, and a potential of the emitter of the transistor TR2 and a potential of the base thereof are equal, and thus no base current passes through the transistor TR2. Thus, the transistor TR2 is in an OFF state, and the ON command signal Von is not output. At this time, the transistor TR1 is in the OFF state, and no current passes through the resistors R1 and R2, and thus no voltage is applied between the gate and the source of the MOSFET that constitutes the main switch 4A. Thus, when the storage battery is unused, the MOSFET that constitutes the main switch 4A is in an OFF state. A dark current of the MOSFET is extremely small, and thus a current passing from the storage battery 2 to the monitoring device 3 at this time can be regarded as zero.

As described above, when the storage battery is unused, the main switch 4A is in the OFF state, and the output voltage of the storage battery 2 is not applied to the monitoring device 3, and thus the monitoring device 3 does not consume electric power. Thus, the storage battery does not discharge even if displayed on store shelves for a long time.

When the storage battery 2 is mounted to, for example, an automobile driven by an engine, and an operation for starting the engine is performed, a large load current passes from the storage battery 2 through the starter motor, and thus the voltage between the output terminals 2a and 2b of the storage battery 2 is reduced. The terminal voltage is 12 to 13 V when the automotive storage battery is unloaded, but reduced to the order of 10 V when the starter motor is driven.

Figure 5:
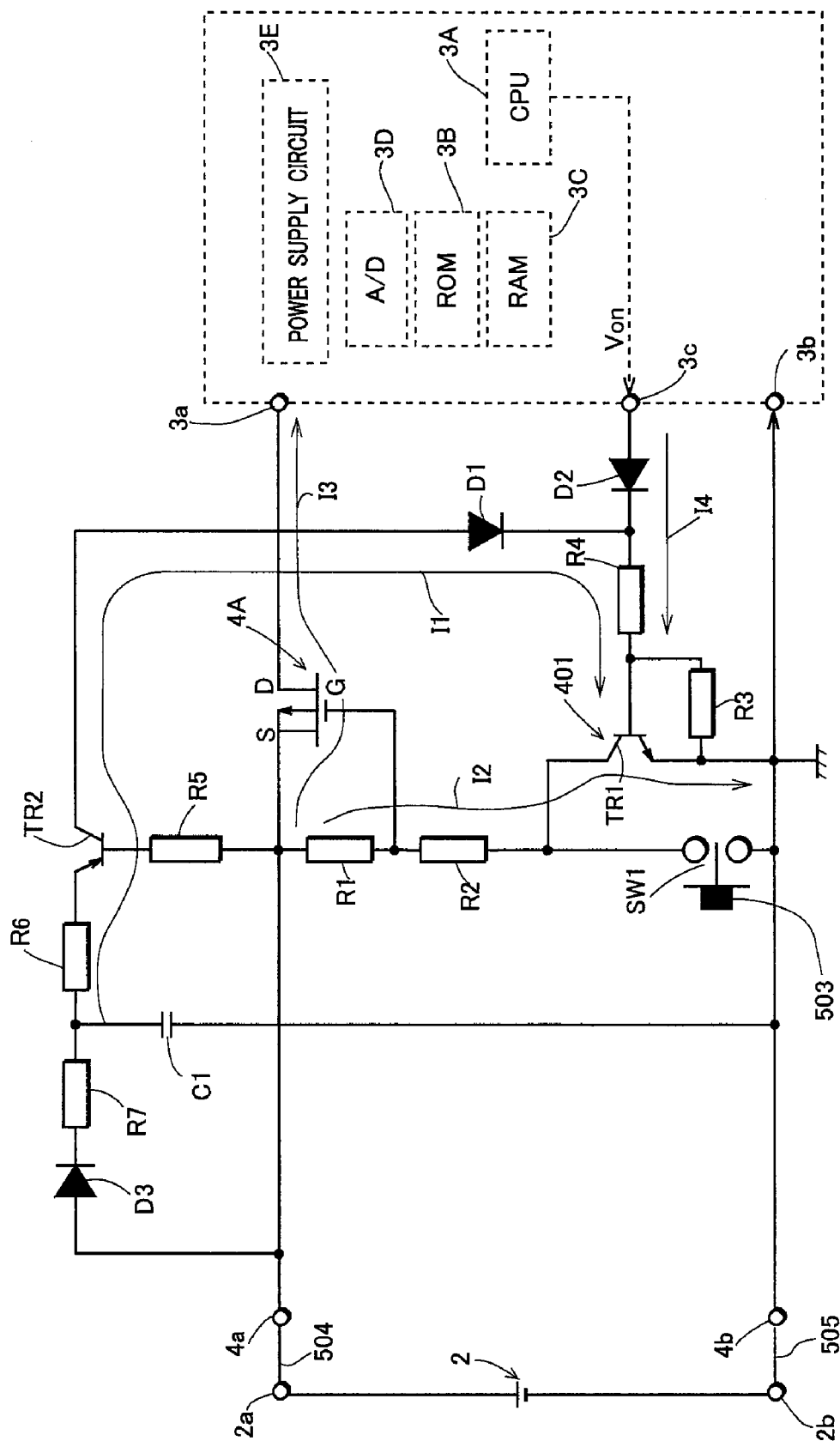
FIG. 5 is a schematic circuit diagram showing a state of a starting circuit used in the storage battery unit in FIG. 1 at the start of an engine.

As described above, when the load is connected to the storage battery 2, the terminal voltage of the storage battery 2 is reduced, while the voltage across the capacitor C1 is not immediately reduced and held at a higher level than the terminal voltage of the storage battery 3 for some time. Thus, the potential of the emitter of the transistor TR2 becomes higher than the potential of the base, a potential difference of 2 to 3 V occurs between the base and the emitter of the transistor TR2, and the base current passes through the transistor TR2 in the path of the capacitor C1—between the emitter and the base of the transistor TR2—the battery 2—the capacitor C1. Thus, the transistor TR2 is set to the ON state, and as shown in FIG. 5, a current I1 passes from the storage battery 2 through the diode D3, the resistors R7 and R6, between the emitter and the collector of the transistor TR2, the diode D1, the resistor R4, and between the base and the emitter of the transistor TR1, and the transistor TR1 that constitutes the driving switch 401 is set to an ON state. Thus, a current I2 passes from the storage battery 2 through the resistors R1 and R2 and between the collector and the emitter of the transistor TR1, and voltage drop occurs across the resistor R1. The voltage drop of the resistor R causes the gate G of the MOSFET that constitutes the main switch 4A to be at a negative potential with respect to the source S, and thus the MOSFET is set to an ON state. Thus, the monitoring device 3 is electrically connected to the storage battery 2 through the main switch 4A, and electric power is supplied to the monitoring device from the storage battery 3 through the main switch 4A.

When the electric power is supplied to the monitoring device 3, the CPU 3A continuously generates the ON command signal Von, and the ON command signal Von is provided to the base of the transistor TR1 through the diode D2 and the resistor R4, and thus a base current I4 passes through the transistor TR1, and the transistor TR1 is held in the ON state. Thus, after the storage battery 2 is mounted to the automobile or the like, and a predetermined load is connected to the storage battery, the current I2 continuously passes, and the main switch 4A is held in the ON state.

As the switch element (the MOSFET in the above example) that constitutes the main switch 4A, a switch element having low ON resistance is selected to reduce voltage drop that occurs in the main switch 4A, thereby preventing the voltage drop in the main switch 4A from exerting an influence on the operation of the monitoring device 3.

As in the above example, the main switch 4A is comprised of the MOSFET with a small dark current, a discharge current of the storage battery does not pass when the storage battery is unused. Thus, even if the storage battery is left unused for a long time, such a situation does not occur that the storage battery completely discharges to reduce discharge properties and become unsaleable.

However, the present invention is not limited to the case using the MOSFET as the main switch 4A, but a bipolar transistor with reduced leak current may be used as the main switch 4A in place of the MOSFET if the storage battery is displayed on store shelves for the order of several mouths.

Figure 6:
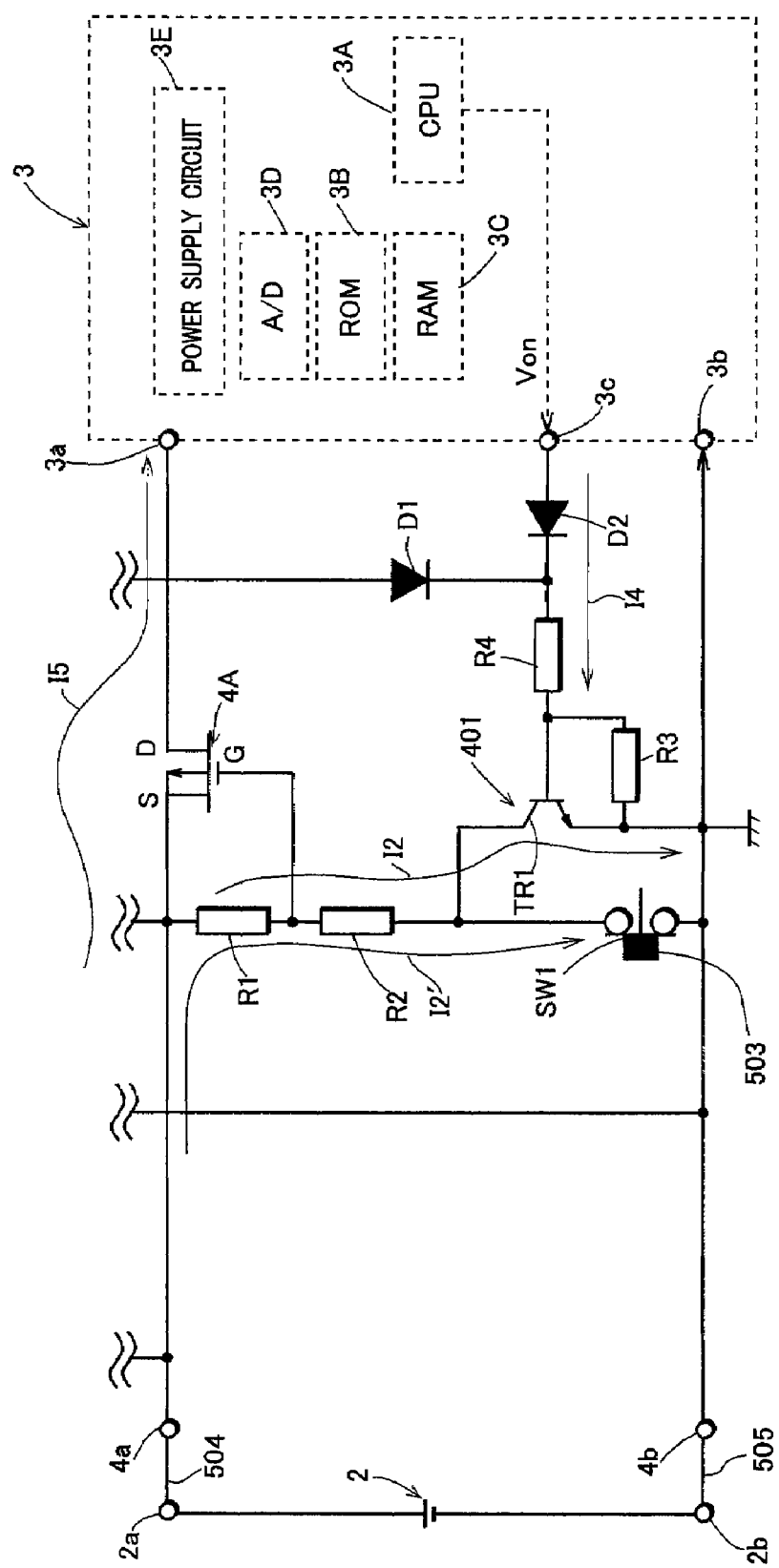
FIG. 6 is a schematic circuit diagram showing a state of the starting circuit used in the storage battery unit in FIG. 1 after the start of the starting circuit.

In the above description, the reduction in terminal voltage of the storage battery that occurs when the load such as the starter motor is connected to the storage battery is detected to set the main switch 4A to the ON state, but even in a state where a load has never been connected to the storage battery 2, the push button 503 is pushed to set the switch SW1 to the ON state and thus set the main switch 4A to the ON state. Specifically, when the switch SW1 is closed, as shown in FIG. 6, a current I2' passes from the storage battery through the resistors R1 and R2 and the switch SW1, and voltage drop that occurs across the resistor R1 by the current I2' causes a drive signal to be provided between the gate and the source of the MOSFET that constitutes the main switch 4A. Thus, the MOSFET is set to the ON state, and the voltage of the storage battery is input to the monitoring device 3. After the voltage is supplied to the monitoring device 3, the ON command signal Von is generated from the monitoring device 3, thus the base current I4 passes through the transistor TR1 to set the transistor to the ON state, and thus the current I2 passes to provide the drive signal to the MOSFET that constitutes the main switch 4A. Thus, even if the switch SW1 is opened, the main switch 4A is held in the ON state.

As described above, in the storage battery unit according to the present invention, the drive signal can be provided to the main switch 4A to connect the monitoring device 3 to the storage battery 2 also by closing the switch SW1 after the storage battery is mounted to the automobile or the like without waiting for the start of the engine. Generally, when the engine is first started after the storage battery is mounted to the automobile, it is preferable to confirm the charging state of the storage battery before a start operation of the engine. Thus, it is preferable to connect the monitoring device 3 to storage battery 2 by first closing the switch SW1 and forcedly setting the main switch 4A to the ON state after the storage battery is connected to the automobile.

When it is likely that the storage battery has been displayed on store shelves for a long time, it may be allowed that before the storage battery is mounted to the automobile or the like, the manual switch SW1 is closed to set the main switch 4A to the ON state, thus the monitoring device 3 is started to display the state of the storage battery 2, the charging state or the deteriorating state of the storage battery is confirmed from the display, and then the storage battery is mounted to the automobile or the like.

In the present invention, as described above, the start operation of the engine always causes the main switch 4A to be set to the ON state to connect the monitoring device to the storage battery. Thus, even if a user omits an operation of closing the switch SW1 to set the main switch 4A to the ON state, the monitoring device can be started without problems.

Figure 7:
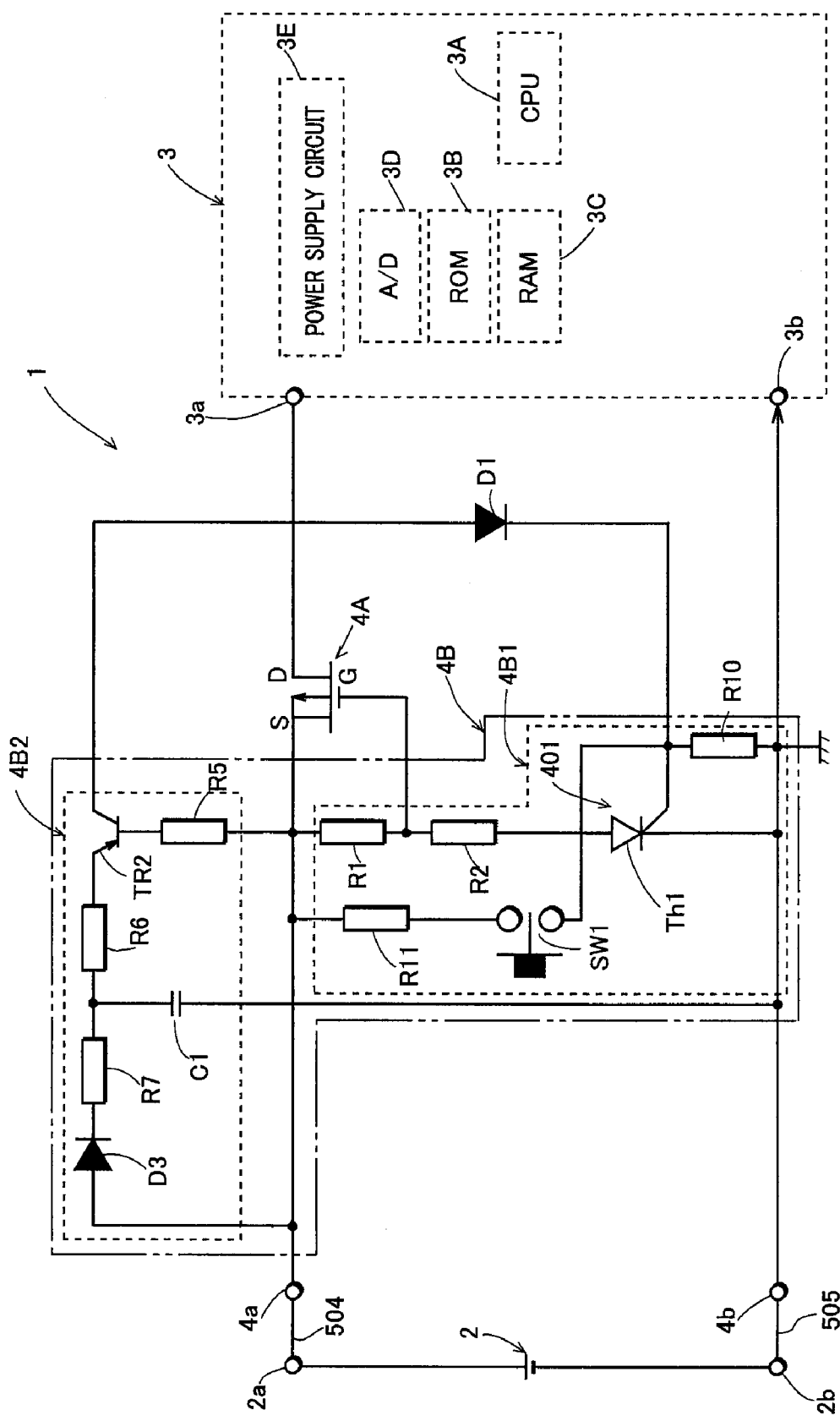
FIG. 7 is a schematic circuit diagram of another example of a construction of a storage battery unit according to the present invention.

In the above described embodiment, the driving switch 401 is comprised of the transistor, and thus in order to continuously provide the drive signal to the main switch 4A, the ON command signal Von needs to be continuously provided from the monitoring device 3 to the drive signal supply circuit. However, a switch element having a self-hold function is used as a driving switch 401 to eliminate the need for outputting the ON command signal from the monitoring device 3. FIG. 7 shows an example in which a thyristor Th1 having a self-hold function is used as a driving switch 401. The thyristor Th1 has a grounded cathode, and an anode connected to a positive input terminal 4*a* of a starting circuit through resistors R1 and R2. A resistor R10 is connected between a gate and a cathode of the thyristor Th1. In this example, a voltage between input terminals 4*a* and 4*b* of the starting circuit is applied between the gate and the cathode of the thyristor Th1 through a resistor R11 and a manual operation switch SW1. Other points are comprised in the same manner as the example in FIG. 1.

In the shown example in FIG. 7, when a load exceeding a set value is connected to a storage battery 2 (for example, a starter motor is connected) and a terminal voltage of the storage battery 2 is reduced, a transistor TR2 is set to an ON state by the same operation as described above, and an ON command signal is provided to the thyristor Th1 from the storage battery 2 through a diode D3, resistors R7 and R6, between an emitter and a collector of the transistor TR2, and a diode D1. Thus, the thyristor Th1 is set to an ON state, and a current passes from the storage battery 2 through resistors R1 and R2 and the thyristor Th1 to provide a drive signal to an MOSFET that constitutes a main switch 4A. If once triggered, the thyristor Th1 holds the ON state as long as the voltage is applied thereto from the storage battery 2. Thus, the main switch 4A can be held in the ON state without generating the ON command signal from the monitoring device 3.

In the example in FIG. 7, the ON command signal can be provided to the thyristor Th1 to set the thyristor to the ON state also by closing the manual operation switch SW1, and the drive signal can be provided to the MOSFET that constitutes the main switch 4A by conduction of the thyristor.

Figure 8:
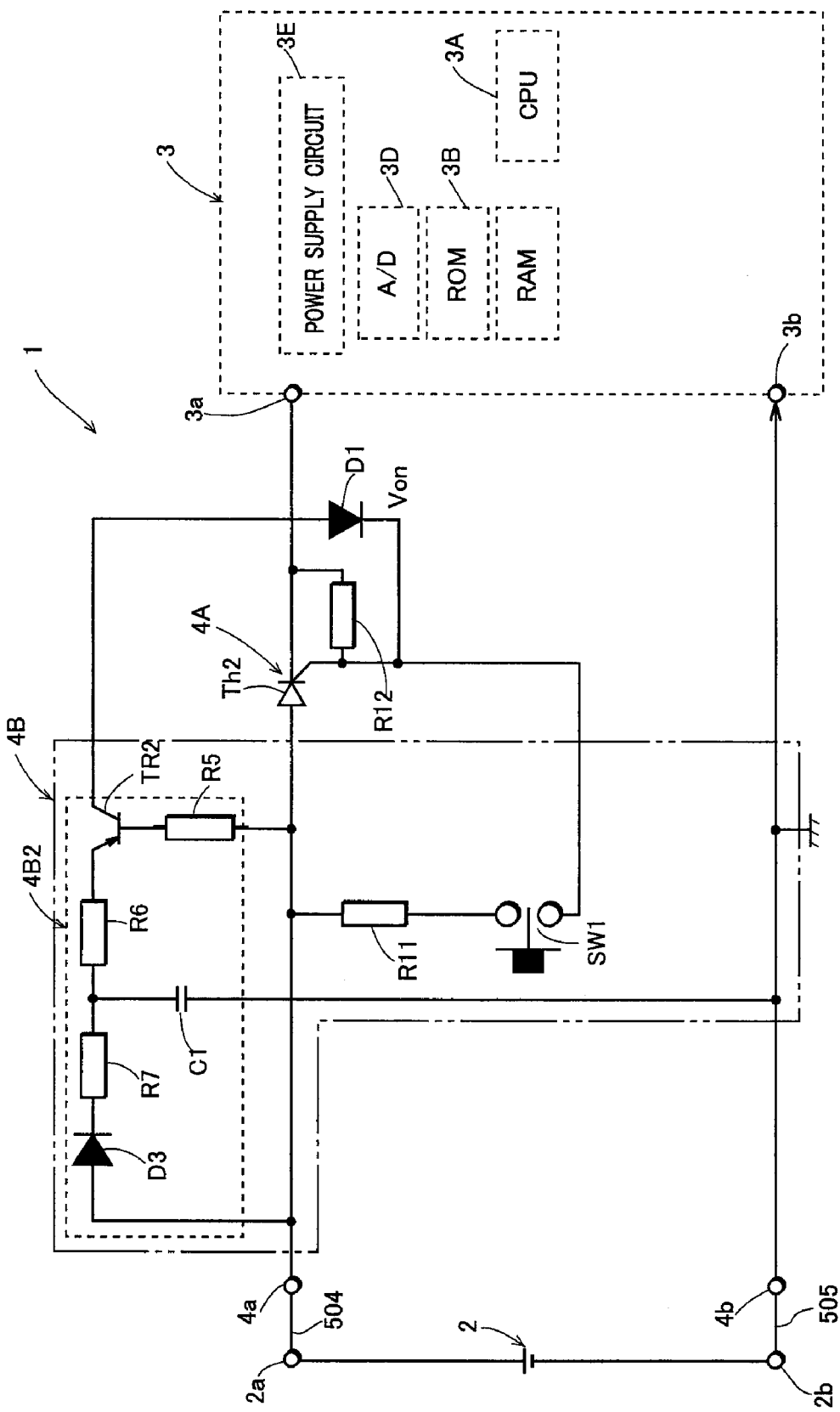
FIG. 8 is a schematic circuit diagram of a further example of a construction of a storage battery unit according to the present invention.

As shown in FIG. 8, the main switch 4A may be comprised of a switch element having a self-hold function. In an example in FIG. 8, a main switch 4A is comprised of a thyristor Th2, and an anode and a cathode of the thyristor Th2 are connected to an input terminal 4*a* of a starting circuit and an input terminal 3*a* of a monitoring device. An ON command signal Von is provided from an ON command signal generation circuit 4B2 through a diode D1 to a gate of the thyristor Th2. Also, an ON command signal is provided from the anode of the thyristor Th2 through a resistor R11 and a manual operation switch SW1 to the gate of the thyristor Th2. A resistor R12 is connected between the gate and the cathode of the thyristor Th2. A drive signal supply circuit including a transistor TR1 and resistors R1 and R2 shown in FIG. 1 is omitted.

In the example in FIG. 8, in a state before a load is connected to a storage battery, a voltage across a capacitor C1 and a terminal voltage of the storage battery 2 are equal, and thus no base current passes through the transistor TR2, and an ON command signal is not provided to the thyristor Th2. Thus, the thyristor Th2 is in an OFF state, and a monitoring device 3 is disconnected from the storage battery 2. When the load is connected to the storage battery 2, and the terminal voltage of the storage battery 2 is reduced, the base current passes through the transistor TR2 to set the transistor TR2 to an ON state, thus the ON command signal is provided to the thyristor Th2 through the transistor TR2 and the diode D1, and the thyristor Th2 is set to the ON state. Thus, the voltage of the storage battery is input to the monitoring device 3 to start the monitoring device 3. If once triggered, the thyristor Th2 holds the ON state after the ON command signal is disappeared, and thus the monitoring device 3 is held in an operation state. The ON command signal can be provided to the thyristor Th2 to set the thyristor to the ON state also by closing a manual operation switch SW1.

In the example in FIG. 8, the main switch 4A is comprised of the thyristor Th2, but it may be allowed that a plurality of MOSFETs or transistors are connected so as to drive each other to constitute a switch having a self-hold function equal to the thyristor, and this switch is used as the main switch 4A.

In the above described embodiment, the thickness of the package is set so that the package 501 of the battery monitoring module 5 does not protrude from the surface of the lid of the battery jar when the package is fitted in the recess 205 provided in the lid of the battery jar, but the present invention is not limited to such a construction, and in some cases, the surface of the package may be placed slightly lower than the upper surface of the lid of the battery jar, or the surface of the package may protrude from the upper surface of the lid within a range that does not prevent mounting of the battery.

In the embodiment, besides the recess 205, the positive lead housing groove 206 and the negative lead housing groove 207 are provided in the upper surface of the lid of the battery jar, and the strip-like portion of the positive battery connecting lead plate 504 and the strip-like portion of the negative battery connecting lead plate 505 are housed in the grooves, but it may be allowed that the positive lead housing groove and the negative lead housing groove are omitted, and the strip-like portion of the positive battery connecting lead plate 504 and the strip-like portion of the negative battery connecting lead plate 505 are placed along the upper surface of the lid of the battery jar.

In the above described embodiment, insulation coating may be applied as required to the strip-like portion of the positive battery connecting lead plate 504 and the strip-like portion of the negative battery connecting lead plate 505. As connection conductors for connecting the battery monitoring module to the positive output terminal and the negative output terminal of the storage battery, lead wires may be used in place of the positive battery connecting lead plate 504 and the negative battery connecting lead plate 505. When the lead wires are used as the connection conductors for connecting the battery monitoring module to the positive output terminal and the negative output terminal of the storage battery, annular terminal fittings (similar to the annular portions 504b and 505b) fitted to the output terminals of the storage battery are preferably mounted to ends of the lead wires connected to the output terminals of the storage battery for facilitating connection of the lead wires to the output terminals of the storage battery.

The storage battery unit according to the present invention is suitable for use as an engine starting power supply of a transportation machine such as an automobile driven by an engine, or a motor driving power supply of a small motor-driven vehicle such as a motor-driven scooter, though the use thereof is not limited. The storage battery itself may have a function of monitoring the state of the battery substantially without changes in contour and dimension of the storage battery that constitutes the above described power supply.

Although a preferred embodiment of the invention has been described and illustrated with reference to the accompanying drawings, it will be understood by those skilled in the art that it is by way of examples, and that various changes and modifications may be made without departing from the spirit and scope of the invention, which is defined only to the appended claims.

What is claimed is:

1. A storage battery unit comprising:
a storage battery in which a generation element including a positive electrode and a negative electrode is housed in a battery jar and positive and negative output terminals are mounted to a lid of said battery jar; and a monitoring device that monitors a state of said storage battery using an output of said storage battery as an input,
wherein a starting circuit is inserted between the output terminal of said storage battery and an input terminal of said monitoring device, and
said starting circuit includes a main switch that holds an OFF state in a state before a load exceeding a set value is connected to said storage battery and interrupts supply of electric power from said storage battery to said monitoring device, and a switch drive circuit that detects a reduction in terminal voltage of said storage battery that occurs when said load is connected to said storage battery, and sets said main switch to an ON state.

2. The storage battery unit according to claim 1, wherein said main switch is comprised of a switch element that is set to an ON state when a drive signal is provided, and inserted between one output terminal of said storage battery and one input terminal of said monitoring device,
said switch drive circuit includes a drive signal supply circuit that has a driving switch that is set to an ON state when an ON command signal is provided and provides a drive signal to said main switch when said driving switch is in the ON state, and an ON command signal generation circuit that provides an ON command signal to said driving switch when detecting a reduction in terminal voltage of said storage battery that occurs in driving said load, and
said monitoring device is comprised so as to continuously provide the ON command signal to said driving switch when a voltage is supplied to said monitoring device from said storage battery through said main switch.

3. The storage battery unit according to claim 1, wherein said main switch is comprised of a switch element that is set to an ON state when a drive signal is provided, and inserted between one output terminal of said storage battery and one input terminal of said monitoring device,
said switch drive circuit includes a drive signal supply circuit that has a driving switch that is set to an ON state when an ON command signal is provided and provides a drive signal to said main switch when said driving switch is in the ON state, and an ON command signal generation circuit that detects a reduction in terminal voltage of said storage battery that occurs in driving said load and provides an ON command signal to said driving switch, and
said driving switch has a self-hold function.

4. The storage battery unit according to claim 1, wherein said main switch is comprised of a switch element having a self-hold function, and inserted between one output terminal of said storage battery and one input terminal of said monitoring device, and
said switch drive circuit is comprised so as to detect a reduction in terminal voltage of said storage battery that occurs in driving said load and provides a drive signal to said main switch.

5. The storage battery unit according to claim 1, 2, 3 or 4, wherein said main switch is comprised of a field-effect transistor or a bipolar transistor.

6. The storage battery unit according to claim 1, 2, 3 or 4, wherein said switch drive circuit has a manual operation switch, and is comprised so as to forcedly provide a drive signal to said main switch when said manual operation switch is operated.

7. The storage battery unit according to claim 1, components of said monitoring device and components of said starting circuit are housed in a common package to constitute a battery monitoring module, and the package of said battery monitoring module is fitted and housed in a recess provided in an upper surface of the lid of the battery jar of said storage battery.

8. The storage battery unit according to claim 7, wherein the package of said battery monitoring module is comprised so as to have an appearance of a flat plate shape, and a battery state display portion that displays a state of said storage battery is provided on a surface of said package exposed through an opening of said recess.

9. The storage battery unit according to claim 7, wherein positive and negative battery connecting lead plates for connecting said starting circuit to a positive output terminal and a negative output terminal, respectively, of said storage battery are led out in opposite directions from one end and the other end of the package of said monitoring module,
each battery connecting lead plate has a strip-like portion connected at one end to a corresponding input terminal of said starting circuit, and an annular portion provided integrally at the other end of said strip-like portion, and is connected to a corresponding output terminal of said storage battery in a state where said annular portion is fitted to the corresponding output terminal of said storage battery, part of the strip-like portion of each battery connecting lead plate is bent to form a shock absorbing portion in the strip-like portion of each battery connecting lead plate, and said shock absorbing portion is deformed to allow expansion and contraction of the strip-like portion of each lead plate.

10. The storage battery unit according to claim 9, wherein a positive lead housing groove having one end connected to said recess and the other end reaching a position near the lower end of the positive output terminal of said storage battery, and a negative lead housing groove having one end connected to said recess and the other end reaching a position near the lower end of the negative output terminal of said storage battery are formed in the upper surface of the lid of said battery jar, and the strip-like portion of said positive battery connecting lead plate and the strip-like portion of said negative battery connecting lead plate are housed in said positive lead housing groove and said negative lead housing groove, respectively.

11. The storage battery unit according to claim 9, wherein the output terminal of said storage battery is tapered so that an upper end has a smaller outer diameter than that of a lower end, the annular portion of each of said positive lead plate and said negative lead plate has an inner diameter smaller than the outer diameter of the lower end of each of said positive output terminal and said negative output terminal, and larger than the outer diameter of the upper end of each of said positive output terminal and said negative output terminal.

12. The storage battery unit according to claim 9, wherein a plurality of slits extending radially of said annular portion are provided at spaced intervals circumferentially of said annular portion in an inner peripheral portion of the annular portion of said each lead plate.

13. The storage battery unit according to claim 9, wherein a thickness of said package is set so that the upper surface of the package of the monitoring module housed in the recess provided in the lid of said battery jar is flush with the upper surface of the lid of said battery jar.

14. The storage battery unit according to claim 9, wherein the thickness of said package is set so that the upper surface of the package of the monitoring module housed in the recess provided in the lid of the battery jar is flush with the upper surface of the lid of said battery jar, and a boundary between the upper surface of the lid of said battery jar and the upper surface of said package is covered with a film.

* * * * *

UNITED STATES PATENT AND TRADEMARK OFFICE
CERTIFICATE OF CORRECTION

PATENT NO. : 7,649,341 B2  Page 1 of 1
APPLICATION NO. : 11/755297
DATED : January 19, 2010
INVENTOR(S) : Shun Kobuse et al.

It is certified that error appears in the above-identified patent and that said Letters Patent is hereby corrected as shown below:

Title Page, item (30) should read    --Foreign Application Priority Data

November 30, 2004 (JP)    2004-345407--

Signed and Sealed this
Eighth Day of February, 2011

David J. Kappos
*Director of the United States Patent and Trademark Office*